United States Patent [19]

Nikias et al.

[11] Patent Number: 5,282,225
[45] Date of Patent: Jan. 25, 1994

[54] ADAPTIVE BLIND CHANNEL EQUALIZER SYSTEM

[75] Inventors: Chrysostomos L. Nikias, Rancho Palos Verdes, Calif.; John G. Proakis, Lexington, Mass.

[73] Assignee: Northeastern University, Boston, Mass.

[21] Appl. No.: 830,674

[22] Filed: Feb. 4, 1992

[51] Int. Cl.$^5$ ............................................. H03H 7/30
[52] U.S. Cl. .................................. 375/14; 364/724.2
[58] Field of Search ............................... 375/12, 14, 8; 333/28 R, 18; 364/724.19, 724.20

[56] References Cited

U.S. PATENT DOCUMENTS

| | | | |
|---|---|---|---|
| 4,709,374 | 11/1987 | Farrow | 375/13 |
| 4,718,073 | 1/1988 | Takaoka | 375/14 |
| 4,985,900 | 1/1991 | Rhind et al. | 333/18 X |

OTHER PUBLICATIONS

J. E. Mazo, "Analysis of Decision-Directed Equalizer Convergence," The Bell System Technical Journal, vol. 59, No. 10, Dec. 1980, pp. 1857-1876.
S. Bellini, F. Rocca, "Blind Deconvolution: Polyspectra or Bussgang Techniques?" Digital Communications, 1986, pp. 251-262.
C. L. Nikias, "Blind Deconvolution Using Higher-Order Statistics," Proceedings, Intern. Workshop on Higher-Order Statistics, France, Jul. 1991, pp. 155-162.
C. L. Nikias, M. R. Raghuveer, "Bispectrum Estimation: A Digital Signal Processing Framework," Proc. IEEE, vol. 75, No. 7, Jul. 1987, pp. 869-891.
A. Bessios, C. L. Nikias, "POTEA: The Power Cepstrum and Tricoherence Equalization Algorithm," IEEE Trans. Signal Processing, submitted Oct. 1990, pp. 1-30, under review.
R. Godfrey, F. Rocca, "Zero Memory Non-Linear Deconvolution," Geophysical Prospecting, vol. 29, 1981, pp. 189-228.
S. Bellini, "Bussgang Techniques for Blind Equalization," IEEE Trans., (CH2298-9/86/0000-1634), 1986, pp. 1634-1640.
A. Benveniste, M. Goursat "Blind Equalizers," IEEE Trans. Comm., vol. COM-32, Aug. 1987, pp. 871-883.
A. Benveniste, M. Goursat, and G. Ruget, "Robust Indentification of a Nonminimum Phase System: Blind Adjustment of a Linear Equalizer in Data Communications," IEEE Trans. Automat. Contr., vol. AC-25, No. 3, 1980, pp. 385-398.
Y. Chen, C. L. Nikias, and J. G. Proakis, "Blind Equalization with CRIMNO: Criterion with Memory Nonlinearity," [To appear in Jun. 1992 Issue of Optical Engineering], pp. 1-27.
Y. Chen, C. L. Nikias, and J. G. Proakis, "CRIMNO: Criterion with Memory Nonlinearity for Blind Equalization," 25th Asilomar Conference on Signals, Systems & Computers, Nov. 4-6, 1991, Pacific Grove, Calif., 5 pages.
H-H. Chiang and C. L. Nikias, "Adaptive Deconvolution and Identification of Nonminimum Phase FIR Sys- (List continued on next page.)

Primary Examiner—Curtis Kuntz
Assistant Examiner—Tesfaldet Bocure
Attorney, Agent, or Firm—Weingarten, Schurgin, Gagnebin & Hayes

[57] ABSTRACT

A channel equalizer system is provided that employs a non-linear technique and a data symbol memory for rapidly adjusting a plurality of equalizer coefficients without using a training sequence. Past data symbols stored in the data symbol memory are used to achieve significantly fast convergence of the equalizer coefficients to their optimum values. Statistical properties of the transmitted data symbols are also exploited. Global convergence is guaranteed by traversing local minima in the convergence process. An expression of performance, referred to as a cost function, includes a plurality of weighted terms that results in more rapid convergence than a conventional cost function with a single term. Still further rapid convergence results when the weights are adaptively adjusted in real-time. The improved performance is achieved with a negligible increase in computational complexity.

24 Claims, 12 Drawing Sheets

OTHER PUBLICATIONS tems Based on Cumulants," IEEE Trans. Automatic Control, vol. AC-35, No. 1, Jan. 1990, pp. 36-47.

Z. Ding, R. A. Kennedy, B. Anderson, and C. R. Johnson, Jr., "Ill-Convergence of Godard Blind Equalizers in Data Communication Systems," IEEE Trans. Comm., vol. 39, No. 9, Sep. 1991, pp. 1313-1327.

G. J. Foschini, "Equalizing Without Altering or Detecting Data," AT&T Tech. Journal, vol. 64, No. 8, Oct. 1985, pp. 1885-1909.

D. N. Godard, "Self-Recovering Equalization and Carrier Tracking in Two-Dimensional Data Communication Systems," IEEE Trans. Comm., vol. COM-28, No. 11, Nov. 1980, pp. 1867-1875.

D. Hatzinakos and C. L. Nikias, "Blind Equalization Using a Tricepstrum-Based Algorithm," IEEE Trans. Comm., vol. COM-29, No. 5, May 1991, pp. 669-682.

O. Macchi and E. Eweda, "Convergence Analysis of Self-Adaptive Equalizers," IEEE Trans. Inform. Theory, vol. IT-30, No. 2, Mar. 1984, pp. 161-176.

G. Picchi and G. Prati, "Blind Equalization and Carrier Recovery Using a 'Stop-and-Go' Decision-Directed Algorithm," IEEE Trans. Comm., vol. COM-35, No. 9, Sep. 1987, pp. 877-887.

M. R. Raghuveer and C. L. Nikias, "Bispectrum Estimation: A Parametric Approach," IEEE Trans. Acoust., Speech, Signal Processing, vol ASSP-33, No. 4, Oct. 1985, pp. 1213-1230.

Y. Sato, "A Method of Self-Recovering Equalization for Multilevel Amplitude-Modulation Systems," IEEE Trans. Comm., vol. COM-23, Jun. 1975, pp. 679-682.

O. Shalvi and E. Weinstein, "New Criteria for Blind Deconvolution of Nonminimum Phase Systems (Channels)," IEEE Trans. Info. Theory, vol. 36, No. 2, Mar. 1990, pp. 312-321.

J. Treichler and B. G. Agee, "A New Approcah to Multipath Correction of Constant Modulus Signals," IEEE Trans. Acoust., Speech, Signal Processing, vol. ASSP-31, No. 2, Apr. 1983, pp. 459-471.

G. Ungerboeck, "Theory on the Speed of Convergence in Adaptive Equalizers for Digital Communication," IBM J. Res. Develop., Nov. 1972, pp. 546-555.

H. L. Van Trees, Detection, Estimation, and Modulation Theory, Part I, John Wiley and Sons, Inc., New York, 1968.

Internal confidential document of inventors C. L. Nikias, J. G. Prokis, and T. Chen, "Northeastern University Invention Disclosure," dated Nov. 15, 1990, containing list of references on 4th page therein.

Internal confidential document of inventors Y. Chen, C. L. Nikias, and J. G. Proakis, "CRIMNO: Criterion With Memory Nonlinearity for Blind Equalization," pp. 1-38, containing references on pp. 23-24 [to appear May 1992 in Journal of Optical Engineering].

Internal confidential document of inventors C. L. Nikias and J. G. Proakis, "Digital Signal Processing Research," Second Monthly Reoprt, Oct. 17, 1990, containing bibliography on p. 23.

A. Papoulis, Probability, Random Variables, and Stochastic Processes, McGraw-Hill, Inc., New York, 1984.

C. L. Nikias, J. G. Proakis, "Blind Equalization Algorithms," Final Report, May 1990.

C. L. Nikias, F. Liu, "Bispectrum Computation Based on Second and Third Order Statistics with Applicatons," Proc. ICASSP '90, Albequerque, New Mexico, Apr. 1990, pp. 2381-2386.

ADAPTIVE BLIND CHANNEL EQUALIZER SYSTEM

The U.S. Government has a paid-up license in this invention and the right in limited circumstances to require the patent owner to license others on reasonable terms as provided for by the terms of contract No. 8433 awarded by the US Air Force.

FIELD OF THE INVENTION

This invention relates to channel equalizers for data communications, and particularly to an adaptive channel equalizer system that does not require a training signal.

BACKGROUND OF THE INVENTION

In a typical digital communications system, data is transmitted between two modems 10, 12 over a communications channel 14, as shown in FIG. 1. Distortion is commonly encountered in high data rate digital transmission over communication channels such as telephone lines and radio channels. In particular, intersymbol interference caused by channel amplitude and phase distortion may be severe. Accordingly, each modem must contain a channel equalizer, which serves to reduce channel distortion so that correct decisions can be made as to which data symbol has been transmitted. The channel equalizer maintains a plurality of parameters which are adjusted so as to reduce channel distortion.

The channel equalizer is usually implemented as a transversal filter 16, shown in FIG. 2, in either hardware or software within a receiving modem. The filter 16 includes a plurality of it parameters called tap coefficients $C_0 \ldots C_N$ which are adjusted adaptively to reduce channel distortion. Currently, the adjustment of the equalizer coefficients $C_0 \ldots C_N$ is performed using a training sequence that is known by an equalizer adjustment apparatus 18 within the receiving modem that is cooperative with the equalizer 16. The equalizer adjustment apparatus 18 then compares the channel-corrupted training sequence detected by a detector 20 in the equalizer 16 with the known original training sequence, and adjusts the equalizer coefficients $C_0 \ldots C_N$ to minimize the mean-square value of the difference between them.

However, there are data communications systems wherein it is either undesirable or impossible to transmit a known training sequence to the receiving modem in order to adjust the parameters of the equalizer. For example, FIG. 3 shows a multipoint communications network 21 wherein data is transmitted from a central location 22 on a communications channel to several receiving modems 24, 26, 28 connected to a channel 30. When one of the receiving modems 24, 26, 28 becomes disconnected from the network 21 due to a malfunction, and is subsequently reconnected upon repair, it is desirable for the equalizer in the modem to self-adjust without the need to transmit a known data pattern. An adaptive equalizer that self-adjusts without the benefit of a known training sequence is said to undergo blind adaptation, and is called a blind equalizer.

Blind equalizers that employ a memoryless nonlinear method for adjusting equalizer coefficients are known, and are used in many telephone channel modems and radio channel modems to provide self-adjustment without the need of transmitting a training sequence. However, such blind equalizers require a substantial amount of time to adjust their coefficients. Consequently, their usefulness is compromised in high data-rate applications.

SUMMARY OF THE INVENTION

A channel equalizer is provided that employs a non-linear technique and a data symbol memory for rapidly adjusting a plurality of equalizer coefficients without using a training sequence. Past data symbols stored in the memory are used to achieve significantly fast convergence of the equalizer coefficients to their optimum values. Statistical properties of the transmitted data symbols are also exploited. Global convergence is guaranteed by traversing local minima in the convergence process. A cost function that includes a plurality of weighted terms results in more rapid convergence than a cost function with a single term. Performance is further improved by adaptively weighting each term in the cost function in real-time. The improved performance is achieved with a negligible increase in computational complexity.

An embodiment of the invention includes an equalizer with a plurality of equalizer coefficients that receives a distorted signal and provides an equalized signal. The equalized signal enters a scaling module, an adaptive weight module and a non-linear function evaluation module with memory. Adaptation of the equalizer coefficients is accomplished by a coefficient update module that receives both the distorted signal and an error signal, and provides an updated vector of equalizer coefficients that supersedes the previous equalizer coefficients maintained within the equalizer.

The non-linear function evaluation module with memory provides the error signal in accordance with a function that is non-linear, includes a plurality of weighted terms, and depends not only upon the current equalizer output, but also on the M most recent equalizer outputs. It is therefore necessary to store the previous M equalizer outputs in a memory. The weights of the terms are provided by an adaptive weight module that receives the equalizer output. A scaling module provides automatic gain control, and thereby scales the equalizer output dynamically such that its output attains the same variance as that of transmitted data. The scaled equalizer output is received by a standard QAM decision module that produces so-termed eye patterns. Essentially, the decision module determines where to place each signal point in the eye pattern based on the scaled equalizer output. The signal constellation can be a 16 16, 8×8, 4×4, or 2×2 array of signal points, or even a pulse amplitude modulation signal with only two signal points.

All of the modules herein described can be implemented in software and executed on a general purpose computer or microprocessor. Alternatively, one or more modules can be implemented as a specialized computational element in cooperation with other specialized hardware for implementing the functionality of the modules.

DESCRIPTION OF THE DRAWING

The invention will be more fully understood from the following detailed description, in conjunction with the accompanying figures in which.

DETAILED DESCRIPTION OF THE INVENTION

Figure 1:
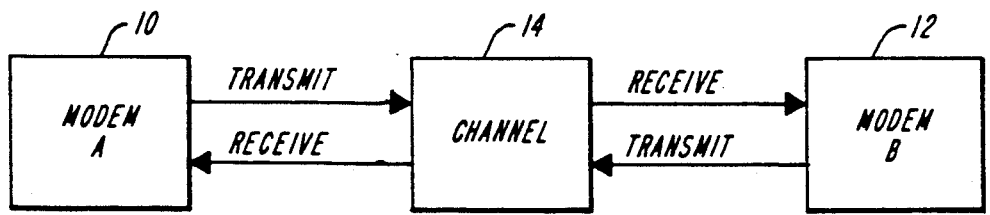
FIG. 1 is a block diagram of two modems communicating over a channel.
Figure 2:
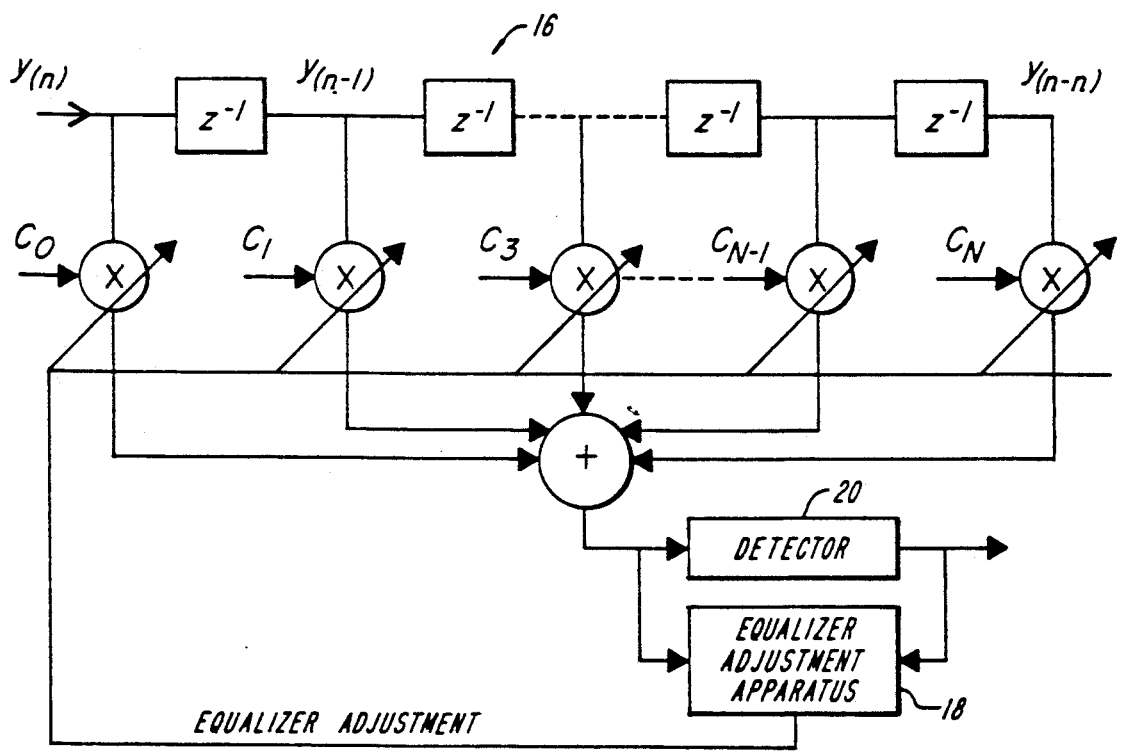
FIG. 2 is a schematic diagram of a prior art channel equalizer.
Figure 3:
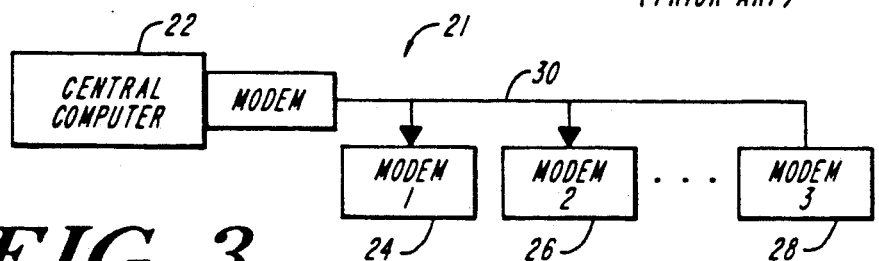
FIG. 3 is a block diagram of a multipoint communications network.
Figure 4:
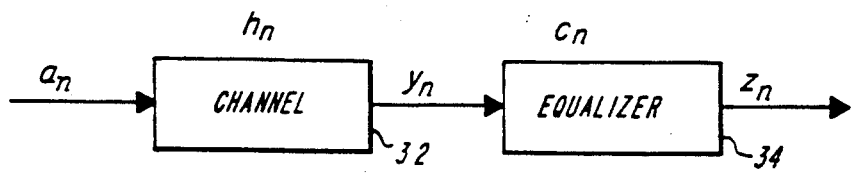
FIG. 4 is a block diagram of a communications channel and an equalizer.

With reference to FIG. 4, the task of blind equalization can be stated as follows: a random sequence $a_n$ of statistically independent and identically distributed data symbols, selected from a finite discrete set, is transmitted through an unknown channel 32 characterized by parameters $h_n$ and is thereby transformed into a distorted received sequence $y_n$; at a receiver that includes an equalizer 34 characterized by a plurality of equalizer coefficients $c_n$, recover a sequence $z_n$ substantially equivalent to the sequence an using only the distorted received sequence $y_n$.

The channel 32 can be, for example, a linear shift-invariant system with unknown impulse response $h_n$. Also, the equalizer 34 restores the sequence $a_n$ in the practical sense, i.e. the probability of error is below a practical threshold value when decisions are made using the output sequence $z_n$ from the equalizer. Such sequence restoration can be attained in both noiseless and noisy environments.

Since most practical communication channels are nonminimum phase, the blind equalization problem cannot be solved using second order statistics. Instead, higher-order statistics, or a nonlinear performance cost function must be used.

If the channel impulse response, i.e., the parameters $h_n$, can be uniquely identified, the blind equalization problem is solved. However, the converse is not true; solving the blind equalization problem does not require that the channel be uniquely identified. For example, when the transmitted data sequence $a_n$ consists of only one value, perfect equalization can easily be attained, even though the channel impulse response $h_n$ may not be known.

The following characteristics of the transmitted data $a_n$ are known:

the transmitted data $a_n$, come from a finite discrete set; and the transmitted data $a_n$ are mutually statistically independent. The probability distribution of the transmitted data $a_n$ may, but need not, be known. Thus, the equalizer of the invention restores the transmitted data $a_n$ given only the received data $y_n$ and partial statistical knowledge about the transmitted data $a_n$. To exploit the property of mutual statistical independence of the transmitted data $a_n$, a memory is used for storing a plurality of data symbols, as will be explained below.

The blind equalization problem can be mathematically stated as follows:

$$y_n = a_n * h_n = \sum_i a_i h_{n-i} \tag{1}$$

$$z_n = y_n * c_n = \sum_i y_i c_{n-i}$$

$$= a_n * s_n = \sum_j a_j s_{n-j}$$

where $$s_n = h_n * c_n = \sum_k h_k c_{n-k}$$

and, the transmitted data symbols $a_n$ come from a finite discrete set, and each data symbol is statistically independent of all other data symbols.

The equalizer coefficients $c_n$ must be adjusted so as to effectively restore the original transmitted data, to within a constant delay. If the distribution v of $a_n$ is non-Gaussian, and if $c_n$ is adjusted such that $z_n$ attains the same distribution v as the transmitted data, the equalizer output $z_n$ restores the original transmitted data except for a constant delay. The equalizer coefficients $c_n$ must be adjusted such that the equalizer output sequence $z_n$ is as close to the transmitted data sequence $a_n$ as possible. To accomplish this, a cost function is constructed that only depends on partial knowledge of the transmitted data. The cost function reaches a minimum if and only if the transmitted data are restored by the equalizer. The cost function can be regarded as a measure of similarity between the equalizer output and the transmitted data.

Now, assume that perfect equalization is achievable, and consider the situation where perfect equalization has indeed been achieved. That is:

$$z_n = a_{n-d} \tag{2}$$

where d is some constant positive integer, which accounts for the constant delay. Since the transmitted data $a_n$ are statistically independent from each other, so are the equalizer outputs $z_n$ at perfect equalization. In addition, for most transmitted data constellations, the mean of $a_n$ is zero. Therefore, at perfect equalization, we have:

$$E(z_n z^*_{n-i}) = E(a_{n-d} a^*_{n-i-d}) = E(a_{n-d})E(a^*_{n-i-d}) = 0 \tag{3}$$

where $E(x)$ represents the statistical expectation operation from probability theory of the argument x, and $R_p = E(|a_n|^{2p})/E(|a_n|^p)$ which generally represents the ratio of the $2p^{th}$ to the $p^{th}$ moment, and particularly represents the average power when $p=1$.

By making use of the property of equation (3), a new class of cost functions is obtained, called cost functions with memory nonlinearity (CRIMNO):

CRIMNO Version I: (no update)

$$M_1^{(p)} = w_0 E(|z_n|^p - R_p)^2 + w_1 |E(z_n z^*_{n-1})|^2 + \ldots + w_M |E(z_n z^*_{n-M})|^2 \quad (4)$$

CRIMNO Version II: (update)

$$M_2^{(p)} = w_0 E(|z_n|^p - R_p)^2 + w_1 |E(z_n z^*_{n-1}{}^{(n)})|^2 + \ldots + w_M |E(z_n z_{n-M}{}^{*(n)})|^2 \quad (5)$$

where $Z_{n-i}{}^{(n)}$ is the calculated equalizer output at $t = n - i$ using equalizer coefficients at $t = n$.

Since each term of a CRIMNO cost function reaches its global minimum at perfect equalization, the convergence speed of an equalization method based on the cost function can be increased by appropriately combining the terms, i.e., assigning a particular multiplicative weight to each term. In this way, the stable local minima inherent in the first term of a CRIMNO cost function can be eliminated, because the weights can be chosen so that the sum of the terms after the first term additively cancel the first term. The second version of the CRIMNO cost function converges even faster than the first version because the most recent equalizer coefficients are used to calculate the equalizer outputs required by the cost function.

The first and second versions of the CRIMNO cost function depend not only on the current equalizer output, but also on the previous equalizer outputs, thereby requiring use of a memory of size M. The parameter p in the CRIMNO cost functions is typically taken to be 2, but any non-negative integer value can be used.

If perfect blind equalization is possible, then a CRIMNO cost function has a global minimum. It is also true that when a CRIMNO cost function has a global minimum, there can be perfect blind equalization. The foregoing two versions of the CRIMNO cost function have global minimum that correspond to perfect blind equalization. Therefore, to achieve perfect blind equalization, the equalizer coefficients must be adjusted so as to obtain the global minimum of the CRIMNO cost function.

A steepest descent method is used to find the global minimum, using the following equations:

Version I:

$$C_{n+1} = C_n - \alpha \frac{\partial M_1^{(p)}}{\partial C_n} \quad (6)$$

Version II:

$$C_{n+1} = C_n - \alpha \frac{\partial M_2^{(p)}}{\partial C_n} \quad (7)$$

where $C_n$ is the vector of the equalizer coefficients, $C_n = [c^{(n)}_{-N2+1}, \ldots c_0^{(n)}, \ldots c^{(n)}_{N1-1}]^T$, where the size N of the vector $C_n$ is $N1 + N2 - 1$, and $\alpha$ is the step-size. By taking the derivative, substituting the expected value with the current value, and setting $p=2$, the following vector equations are obtained. CRIMNO version I:

$$C_{n+1} = C_n - \alpha Y^*_n z_n [4w_0|z_n|^2 + 2w_1|z_{n-1}|^2 + \ldots + 2w_M |z_{n-M}|^2 - 4w_0 R_2] \quad (8)$$

CRIMNO version II:

$$C_{n+1} = C_n - \alpha[4w_0 Y^*_n z_n (|z_n|^2 - R_2) + 2w_1(Y^*_n z_n |z_{n-1}{}^{(n)}|^2 + Y_{n-1}{}^* z_{n-1}{}^{(n)}|z_n|^2) + \ldots + 2w_M(Y^*_n z_n |z_{n-M}{}^{(n)}|^2 + Y^*_{n-M} z_{n-M}{}^{(n)}|z_n|^2)] \quad (9)$$

where $Y_n = [Y_n, \ldots, Y_{n+N-1}]^T$ is the vector of the receiver signals, and $N = N1 + N2 - 1$ is the length of equalizer.

A CRIMNO cost function can be placed in the general form of a Bussgang technique. In a Bussgang technique, the corresponding equalizer output is:

$$z_n = Y_n^T C_n = a_n + e_n \quad (10)$$

where $n = 1, 2$, and $C_n$ is a vector of the equalizer coefficients at the $n^{th}$ iteration. At the $(n+1)^{th}$ iteration, a Bussgang technique consists of the following two equations:

$$C_{n+1} = C_n - \alpha Y_n^* e_n \quad (11)$$

$$e_n = z_n - g[Z_n] \quad (12)$$

where an optimum estimate of $a_n$ at the $n^{th}$ iteration is denoted by $g[Z_n]$, where $Z_n$ stands for $\{z_i; i = 1, \ldots, n - M\}$. The optimum estimate can be obtained using a mean-square error or a maximum aposteriori technique. Different nonlinear functions $g[Z_n]$ lead to different performance. One subclass of $g[Z_n]$ is the class of memoryless nonlinear functions, where $g[Z_n]$ is only a function of the current equalizer output $z_n$.

By contrast, the first version of the CRIMNO cost function belongs to the subclass of $g[Z_n]$ that includes nonlinear functions with memory. In particular, by comparing equation (8) with equations (11) and (12), it can be seen that the nonlinear function $g[Z_n]$ associated with the first version of the CRIMNO cost function is given by:

$$g[Z_n] = z_n - z_n[4w_0|z_n|^2 + 2w_1|z_{n-1}|^2 + \ldots + 2w_M|z_{n-M}|^2 - 4w_0 R_2] \quad (13)$$

Note that $g[Z_n]$ is a function not only of the current equalizer output $z_n$, but also of the previous equalizer outputs $\{z_k : n - M \leq k \leq n\}$. The first $M+1$ term in the square bracket of equation (13) is a weighted sum of $\{|z_n|^2, |z_{n-1}|^2, \ldots, |z_{n-M}|^2\}$. As such, it can be regarded as a way of calculating the expected value $E(|z_n|^2)$. Consequently, the first version of the CRIMNO cost function amounts substantially to the original single point estimate of $E(|z_n|^2)$, $|z_n|^2$, with a more accurate estimate involving a weighted sum of $M+1$ terms.

At perfect equalization, $E(|Z_n|^2) = E(|z_{n-1}|^2) = \ldots = E(|z_{n-M}|^2)$. Thus the first $M+1$ terms in the square bracket of equation (13) is an estimate of $\gamma E(|z_n|^2)$, where $\gamma = 4w_0 + 2w_1 + \ldots + 2w_M$. To prevent constellation eye shrinkage, the signal $z_n$ is dynamically scaled to provide automatic gain control such that it attains the same variance as the transmitted data $a_n$.

Further regarding convergence of the CRIMNO cost functions, the global minimum of the CRIMNO cost functions is shown to lead to minimum residual intersymbol interference. The first term taken in isolation exhibits local minima, and therefore results in undesired equilibria. However, the terms added to the first term in the CRIMNO cost function are shown to help reduce the number of local minima, and therefore reduce the undesired equilibria. Thus, the global minimum of the CRIMNO cost function leads to perfect equalization, because the terms beyond the first term in the CRIMNO cost function help reduce the undesirable equilibria inherent in the first term.

In general, except for perfect equalization, the equilibria of different terms do not coincide with each other. That is, the $s_n$ which attains an equilibrium for one term may not do that for other terms. Thus, we can reduce the number of undesirable equilibria by increasing the memory size M and by properly choosing the weight of each term.

The global minimum of the CRIMNO cost functions leads to minimum intersymbol interference in the case of a finite length equalizer of sufficient length. The terms added to the first term in the CRIMNO cost functions help eliminate the undesirable local minima inherent in the first term so that the global minimum can be achieved.

Figure 6A:
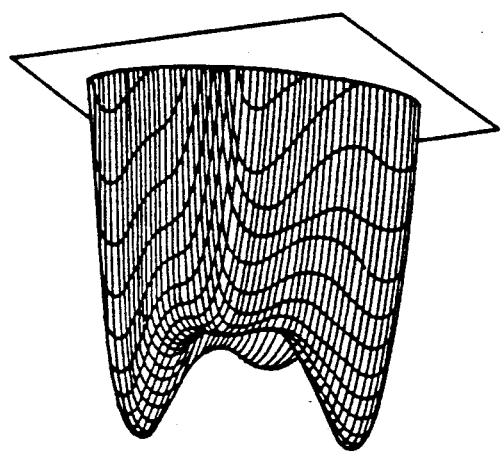
FIGS. 6A and 6C are a 3-D plot and corresponding contour map of a conventional cost function with a single term.
Figure 6C:
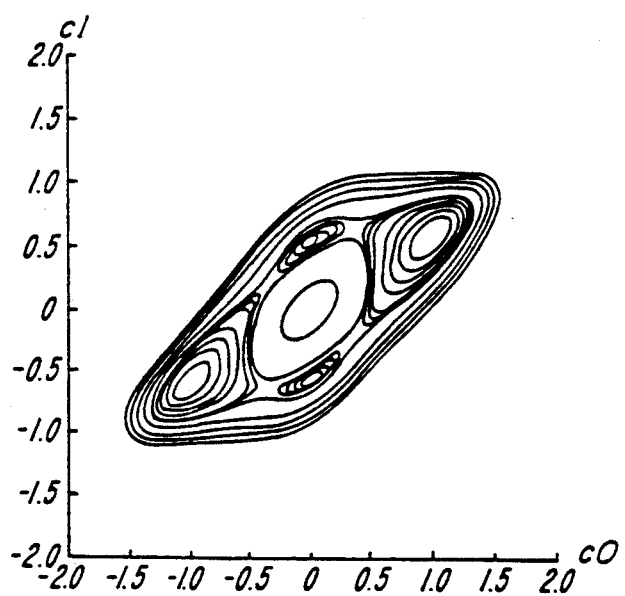

To illustrate the local minima inherent in the first term of a CRIMNO cost function, FIG. 6A shows a 3-D plot of the first term, and FIG. 6C shows the corresponding contour map. It can clearly be seen that the first term of the CRIMNO cost function has stable a local minima at $(0, \pm 0.5575)$.

Figure 6B:
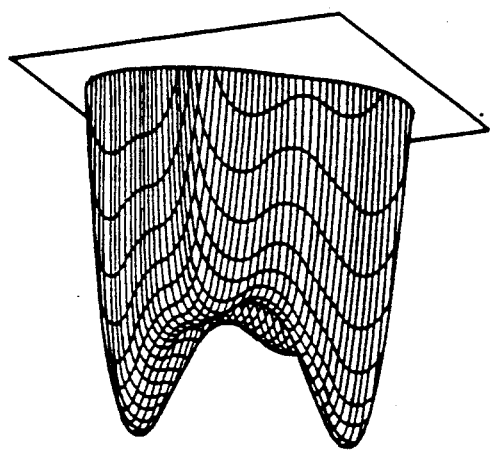
FIGS. 6B and 6D are a 3-D plot and corresponding contour map of a second version of the CRIMNO cost function.
Figure 6D:
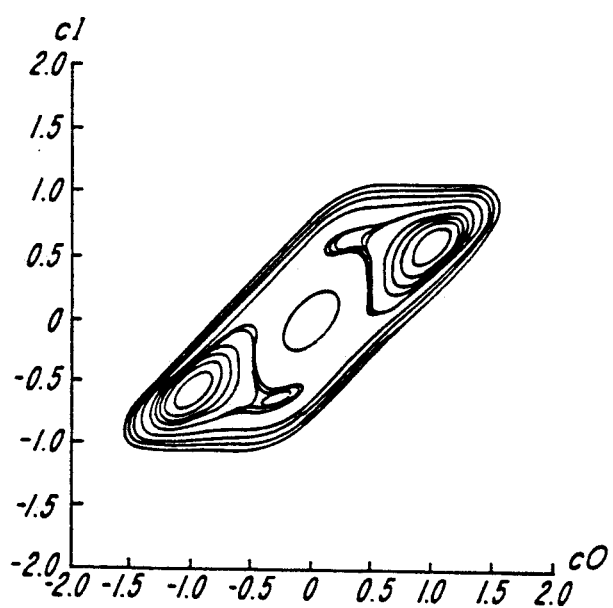

FIGS. 6B and 6D show the 3-D plot and contour map of the CRIMNO II cost function, with memory size $M=1$ and $w_0=1$, $w_1=2$. Note that it has no local minima. Therefore, CRIMNO cost functions can avoid local minima if the weights of the added terms are chosen properly.

Thus, the performance of the CRIMNO cost functions, e.g., the critical convergence speed and convergence effectiveness, depends on the choice of weights $w_i$. A method for adjusting the weights in real-time during the blind equalization process will now be presented.

The basic idea is this: the value of each term in the CRIMNO cost function is estimated, and the weights are set proportional to the deviations of the corresponding terms from their ideal value at perfect equalization.

Consider CRIMNO version I:

$$M_1^{(p)} = w_0 E(|z_n|^p - R_p)^2 + w_1 |E(z_n z^*_{n-1})|^2 + \ldots + w_M |E(z_n z^*_{n-M})|^2 \quad (14)$$

The cost function can be expressed as follows:

$$M_1^{(p)} = w_0 J_0 + w_1 J_1 + \ldots + w_M J_M \quad (15)$$

where $$J_0 = E(|z_n|^p - R_p)^2$$

$$J_i = |E(z_n z^*_{n-i})|^2 \quad 1 \leq i \leq M \quad (16)$$

for a statistically independent, uncorrelated sequence.

For a statistically dependent sequence $\{a_n\}$ of a known autocorrelation $R(i)$, where $i=1,\ldots,M$, then $$J_i = |E(z_n z^*_{n-i}) - R(i)|^2.$$

Note that if the elements of the sequence $\{a_n\}$ are independent, then $R(i)=0$ for all $i \neq 0$, as in equation (29).

The deviation of the ith term $D(J_i)$ is defined by $$D(J_i) \stackrel{def}{=} |J_i - J_i^{(0)}| \quad (17)$$

where $J_i^{(0)}$ is the value of $J_i$ at perfect equalization. Then the weights are adjusted using the following formulas:

$$w_0 = \begin{cases} \gamma_0 D(J_0) & \gamma_0 D(J_0) < \lambda \\ \lambda & \gamma_0 D(J_0) \geq \lambda \end{cases} \quad (18)$$

$$w_i = \begin{cases} \gamma D(J_i) & \gamma D(J_i) < \lambda \\ \lambda & \gamma D(J_i) \geq \lambda \end{cases}$$

where $\gamma_0$ and $\gamma$ are positive scaling constants; and X is a constraint on the maximum value of the weights for the sake of stability of the cost function.

The cost function with weights that are adjusted in real-time while the equalizer is on-line is called the Adaptive Weight CRIMNO cost function. Adjustment of the weights is done automatically. When the technique converges, the weights decrease toward zero. Hence, the adaptive weight CRIMNO cost function results in decreasing step-size, which has been proven to be an optimal strategy for equalization.

The adaptive weight CRIMNO cost function cannot be trapped for long at a local minimum, if one exists at all, because the cost function can very quickly move out of the local minimum. Moreover, the larger the deviation, the quicker the cost function will move out of the local minimum, thereby providing better performance. Two factors contribute to the improvement: the terms added to the first term that employ the memory of length M; and the adaptive adjustment of the weights.

Blocks of data are used to estimate $J_i$. Their values are used to update the weights in the next block. A sufficiently long block length should be used to make the variance of the estimates small. Because of the nature of the first term, $J_0$ is different from the other $J_i$, and $\gamma_0$ is different from $\gamma$.

In the forgoing discussion, it was assumed that noise is absent and the exact expected values are used. By means of computer simulations, the performance of CRIMNO and the adaptive weight CRIMNO cost functions under noisy conditions will be presented, and it will be shown how they compare with that of a cost function with only a first term.

Figure 5A:
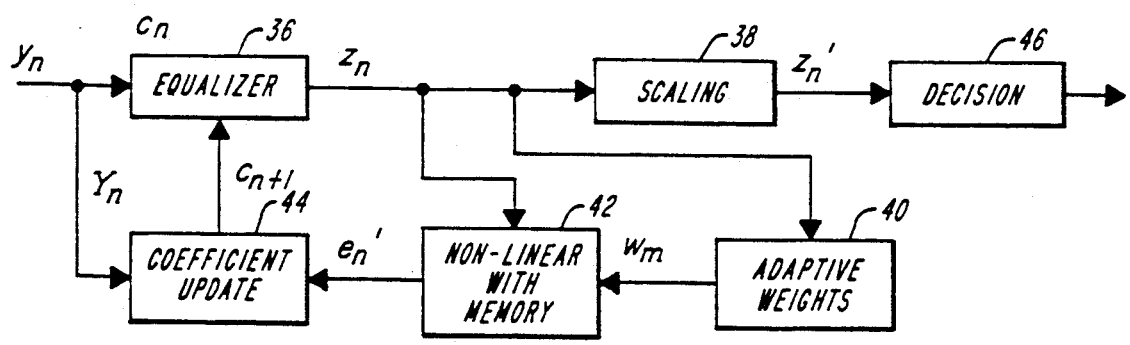
FIG. 5A is a block diagram of an embodiment of the blind equalizer of the invention.
Figure 5B:
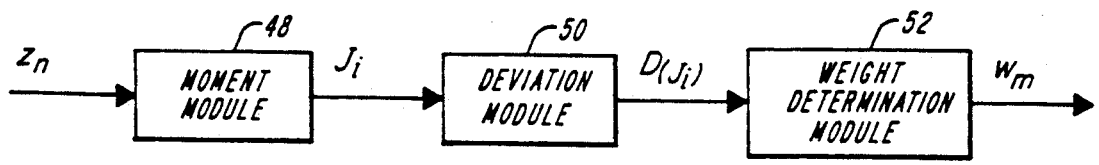
FIG. 5B is a block diagram of an adaptive weight module of the embodiment of FIG. 5A.

A simulation system is set up in accordance with the embodiment of FIG. 5. This embodiment includes an equalizer 36 that receives a distorted signal $y_n$, and provides an equalized signal $z_n$. The signal $z_n$ enters a scaling module 38, an adaptive weight module 40 and a non-linear function evaluation module with memory 42.

Figure 7A:
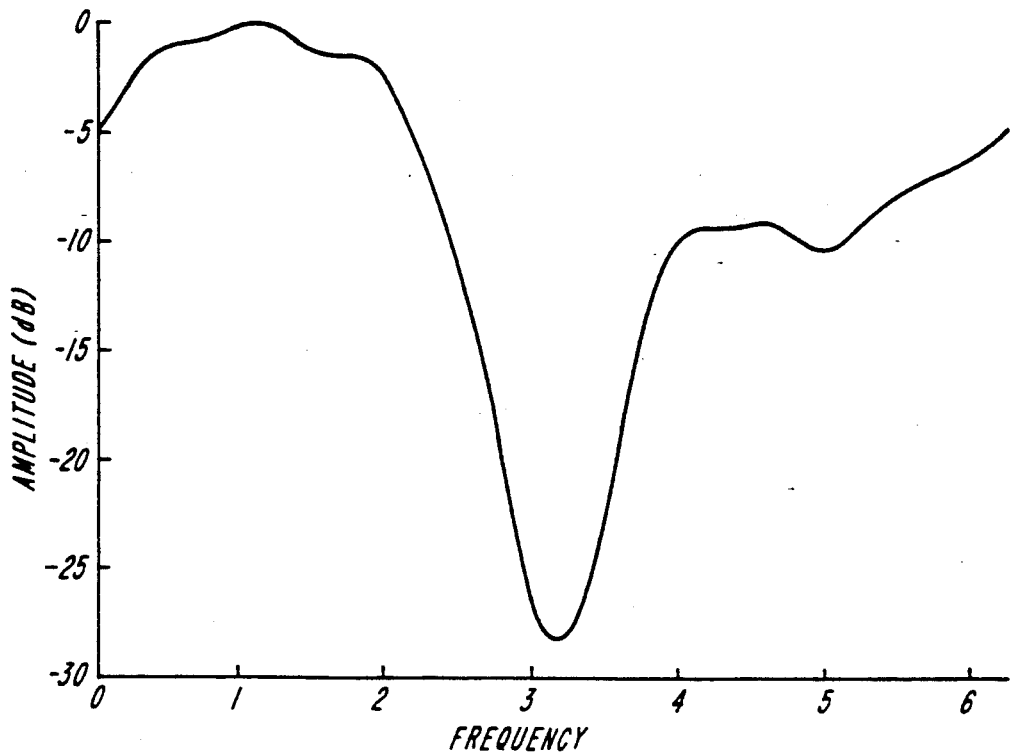
FIGS. 7A and 7B are graphs of the characteristics of the simulated communications channel, showing magnitude and phase response, respectively.
Figure 7B:
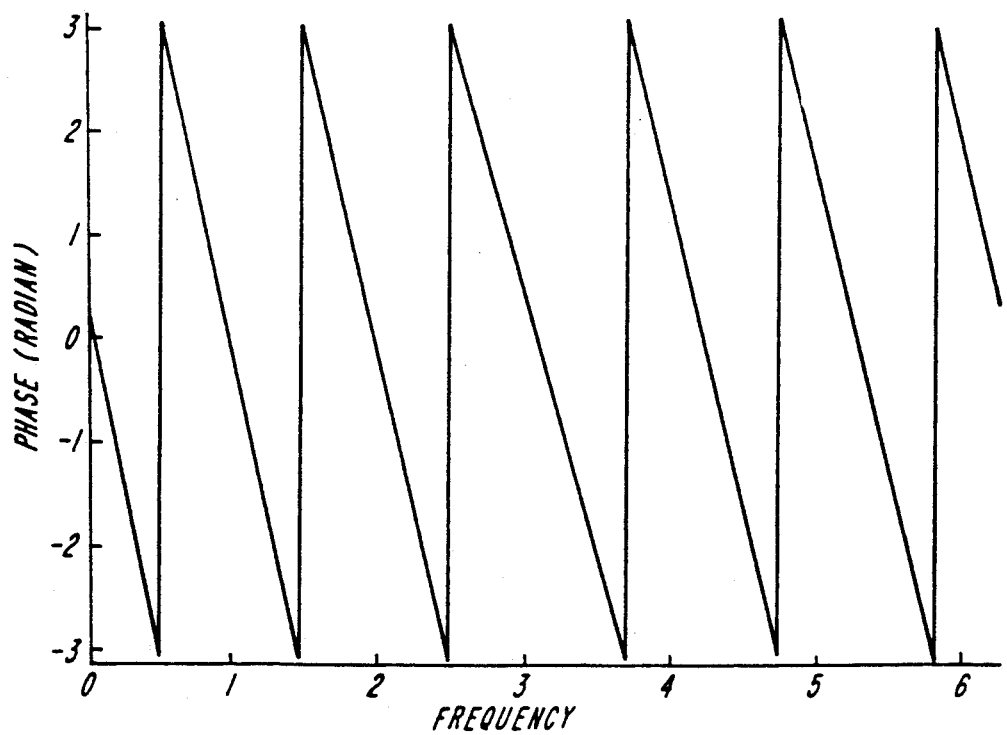

The characteristics of the channel utilized for simulations that provides the distorted signal $y_n$ are illustrated in FIGS. 7A and 7B. The transmitted data constellation is a quadrature amplitude modulation (QAM) constellation consisting of an eight-by-eight array of signal points, where each signal point represents a different combination of signal phase and amplitude. The additive noise in the received signal is Gaussian and white. The length M of the equalizer is 31. Initial setting of the equalizer coefficients is as follows:

$$c(i) = \begin{cases} 1 & i = d \\ 0 & \text{otherwise} \end{cases} \tag{19}$$

where d is the location of the greatest coefficient in the impulse response of the channel inverse.

Adaptation of the equalizer coefficients is accomplished in accordance with equation (11). A coefficient update module 44 receives both the distorted signal $y_n$ as a vector $y_n$, and an error signal $e'_n$, and provides an updated vector of equalizer coefficients $C_{n+1}$ that supersedes the vector of equalizer coefficients $C_n$ maintained within the equalizer 36.

To provide the error signal $e'_n$ equations (12) and (13) are implemented by the non-linear function evaluation module with memory 42. The function $g[z_n]$ is non-linear, and is a function not only of the current equalizer output $z_n$, but also of the M most recent equalizer outputs $\{z_k : n-M \leq k < n\}$. It is therefore necessary to store the previous M equalizer outputs in a memory.

The weights $w_0 - w_M$ are provided in accordance with equations (29), (30), and (31), described above, by an adaptive weight module 40 that receives the equalizer output $z_n$. The module 40 must also include a memory to store the most recent weights $w_0 - w_M$. For the adaptive weight CRIMNO cost function, blocks of data are used to estimate the $\{J_i : 0 \leq i \leq M\}$ for updating the weights $w_0 - w_M$. The block length utilized in the simulations is 2000.

The adaptive weight module 40 includes a moment module 48 that is responsive to the equalizer output $z_n$. The module 40 determines a current moment $J_0$ and a plurality of subsequent moments $J_i$. A deviation module connected to the moment module 48 provides a deviation that includes the norm of the difference between a subsequent moment $J_i$ and a moment at perfect equalization $J_i^{(0)}$. A weight determination module 52 is connected to the deviation module 50. The weight determination module 52 provides a first weight that is proportional by a positive scaling constant to a deviation of the current moment from the moment at perfect equalization, only if the first weight is less than a stability threshold $\lambda$, otherwise providing the stability threshold $\lambda$ as the first weight. The weight determination module 52 also provides at least one subsequent weight that is proportional by a positive scaling constant to a deviation of the current moment from the moment at perfect equalization, only if the subsequent weight is less than the stability threshold $\lambda$, otherwise providing the stability threshold $\lambda$ as the subsequent weight.

The scaling module 38 provides automatic gain control (AGC) and thereby scales the equalizer output $z_n$ dynamically, such that its output $z_n'$ attains the same variance as that of transmitted data $a_n$. The scaling module 38 works as follows:

$$z_n' = v_n * z_n \tag{20}$$

$$v_n = \frac{E(|a_n|^2)}{E(|z_n|^2)} \tag{21}$$

$$E(|z_n|^2) = (1 - \beta)E(|z_{n-1}|^2) + \beta |z_n|^2 \tag{22}$$

where $\beta$ is the forgetting factor, which is chosen to be $5 \times 10^{-6}$ in the present simulations.

Figure 10A:
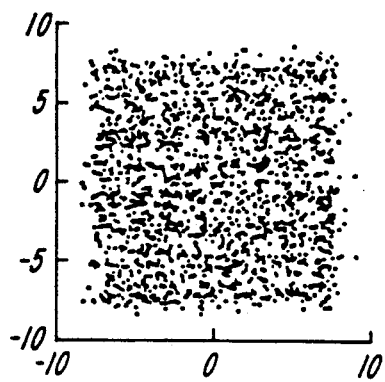
FIGS. 10A-10D are equalizer eye patterns of the cost functions of FIGS. 9A-9C at the 20,0000$^{th}$ iteration.
Figure 10B:
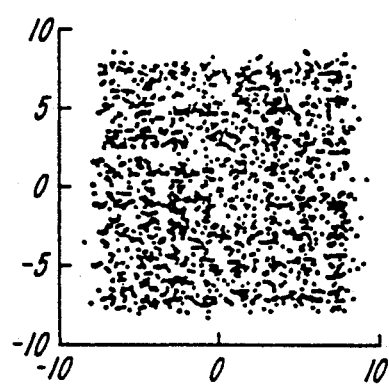
Figure 10C:
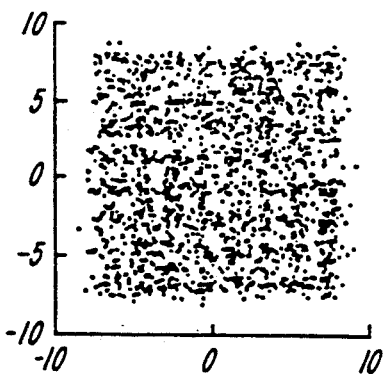
Figure 10D:
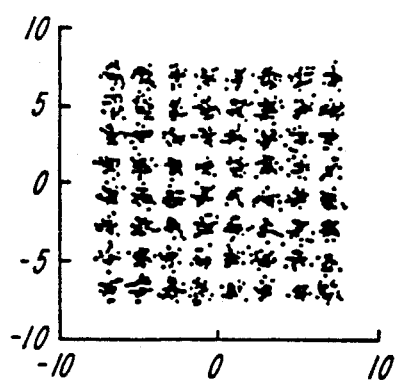

The scaled equalizer output $z_n'$, is received by a standard QAM decision module 46 that produces the so-termed eye patterns, as shown in FIG. 10D, for example. Essentially, the decision module 46 determines where to place each signal point in the eye pattern based on the signal $z_n'$.

All of the modules 36–46 can be implemented in software and executed on a general purpose computer or microprocessor. Alternatively, one or more modules can be implemented as a specialized computational element in cooperation with other specialized hardware for implementing the functionality of the modules 36–46 as herein described. Moreover, all of the equations articulated herein can be expressed in many equivalent forms, and can be partitioned in myriad ways, nevertheless having the same overall substantive effect.

The performance of CRIMNO (I, II) and the adaptive weight CRIMNO cost functions can be compared with that of a cost function with only a single term. The comparison is done by means of four different but related metrics:

the mean square error (MSE) calculated a posteriori and averaged over an interval of 1000 samples;

the symbol error rate (SER) percentage of wrongly detected symbols calculated every 1000 symbols;

intersymbol interference (ISI) calculated using the following equation assuming that the channel impulse response is known, $$ISI = \frac{\sum_i |s_i|^2 - \max(|s_i|^2)}{\max(|s_i|^2)} \tag{23}$$

where $s_i = h_i * c_i$ (* denotes convolution) is the combined impulse response; and an eye pattern, i.e., the distribution of equalizer outputs.

Figure 8A:
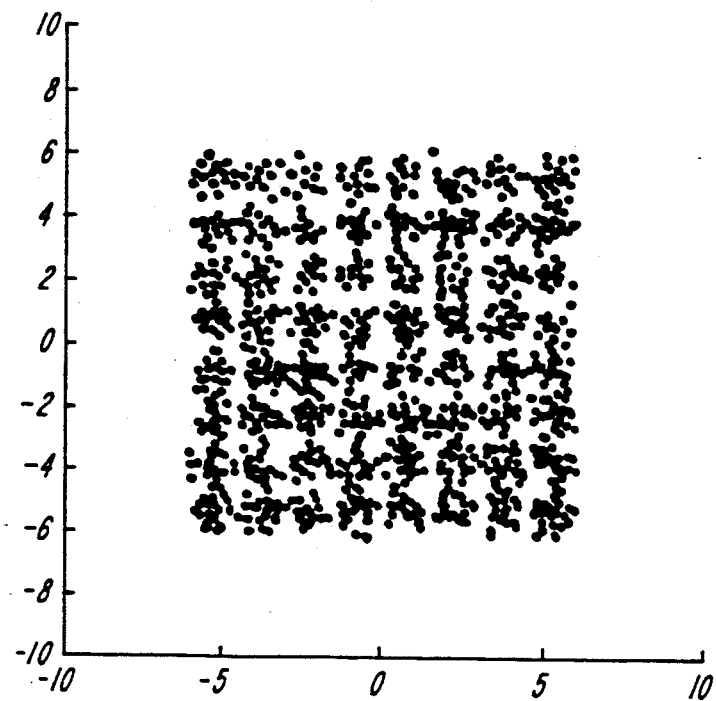
FIGS. 8A and 8b are equalizer eye patterns prior to the operation of a scaling module and after the operation of the scaling module, respectively.
Figure 8B:
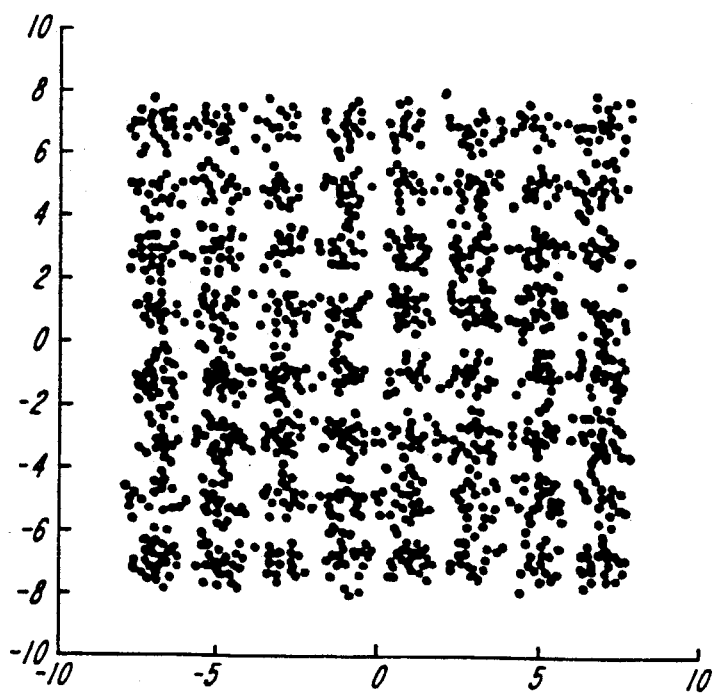

FIGS. 8A and 8b show an eye patterns prior to the operation of the scaling module 38 and after the operation of the scaling module 38, respectively. Thus, FIG. 8A is an example of constellation eye shrinkage of the CRIMNO cost functions, and FIG. 8B represents the correction of such shrinkage by the scaling module 38.

Figure 9A:
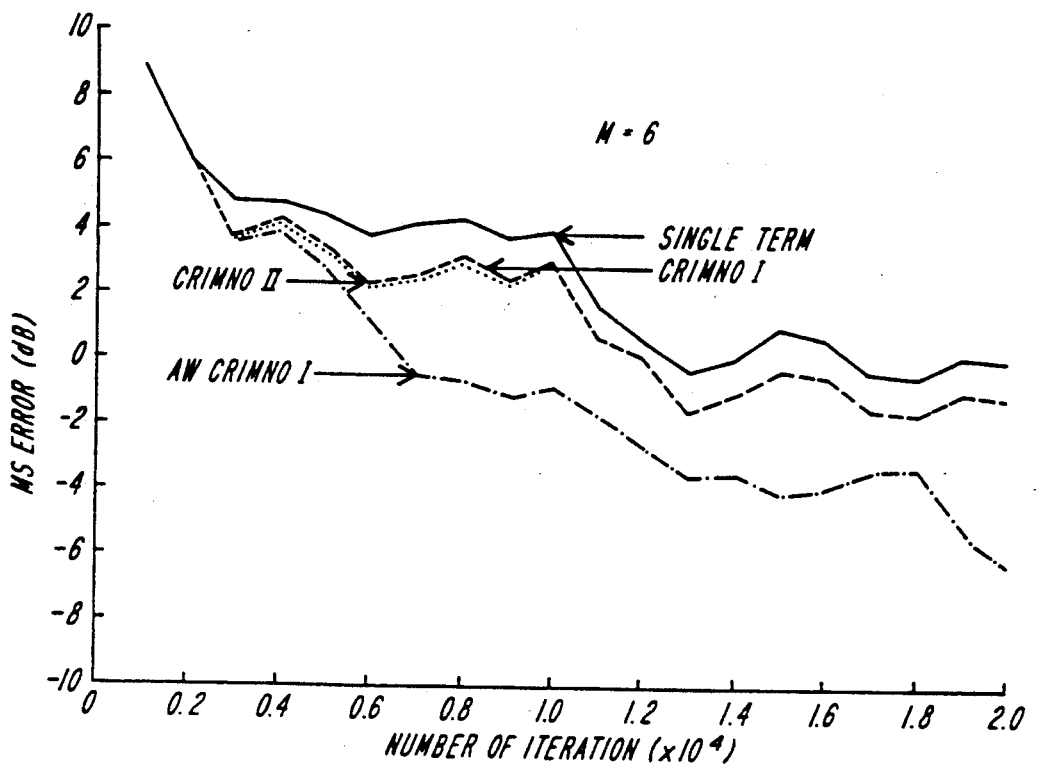
FIGS. 9A, 9B, and 9c are graphs of the MSE, SER, and ISI performance parameters of the first and second versions of the CRIMNO cost function, an adaptive weight CRIMNO cost function, and a cost function with a single term.
Figure 9B:
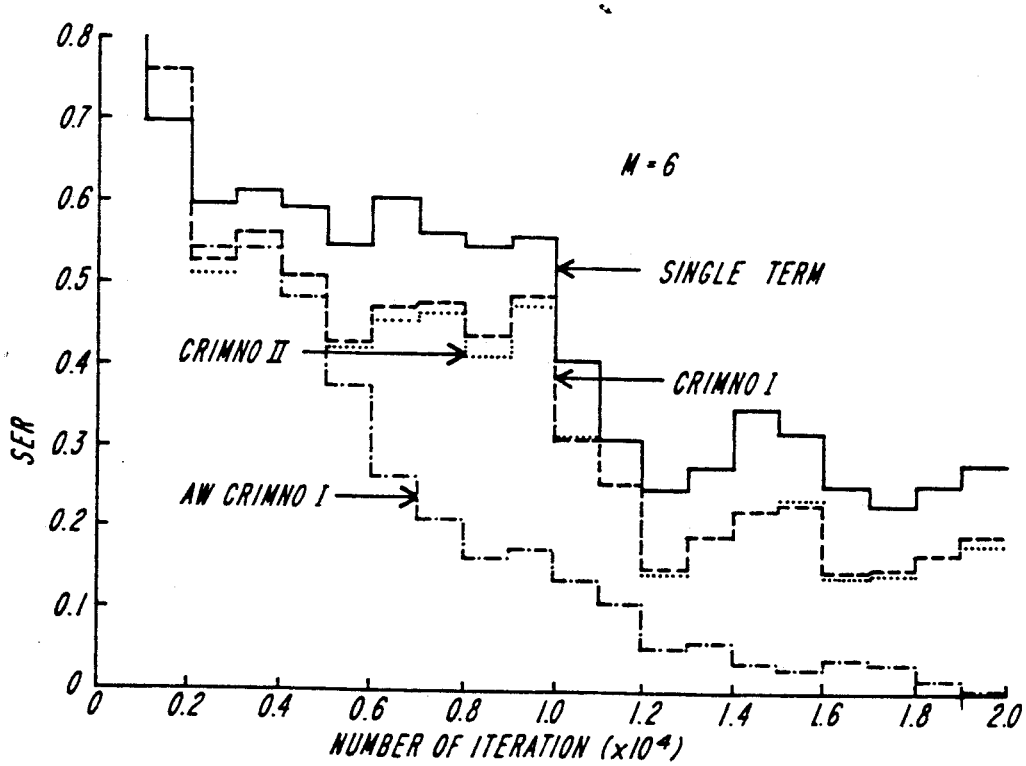
Figure 9C:
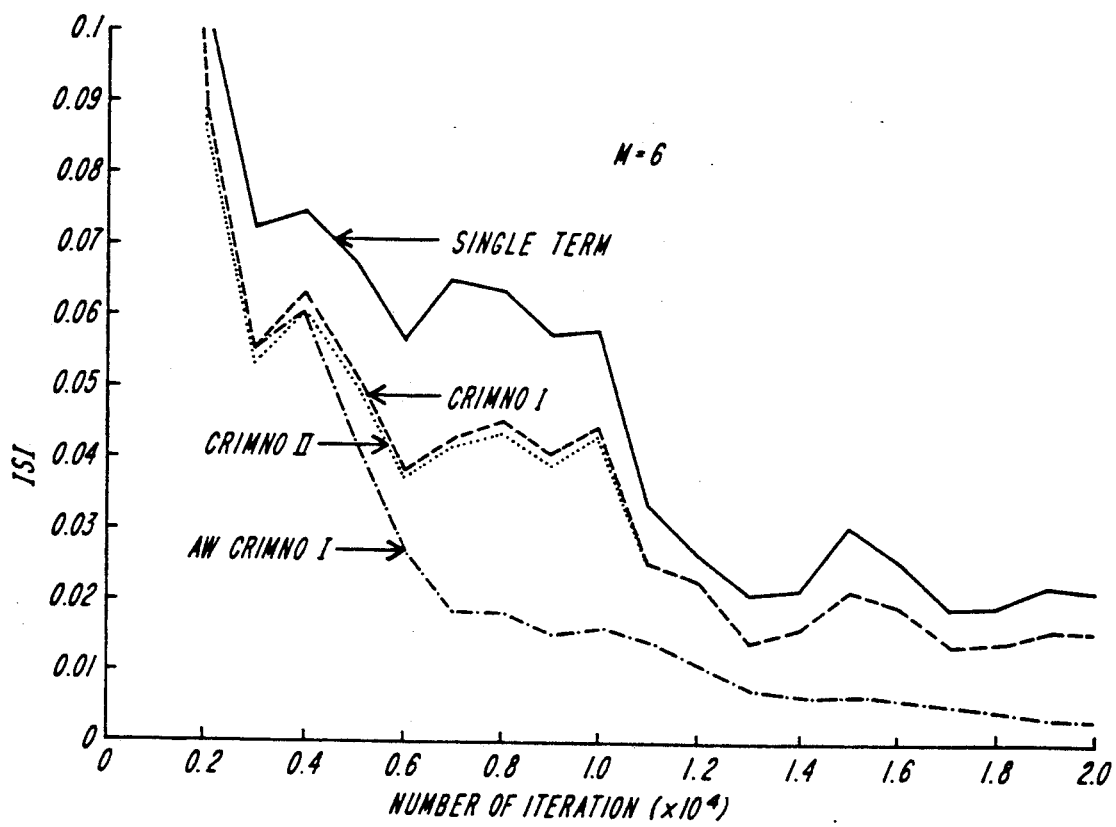

FIGS. 9A, 9B, and 9C show the performance (MSE, SER, and ISI) of the first and second versions of the CRIMNO cost function, the adaptive weight CRIMNO cost function, and the cost function with a single term. Note that adaptive weight (AW) CRIMNO performs substantially better than CRIMNO I and II, which in turn perform substantially better than a cost function with a single term. Specifically, AW CRIMNO has a lower mean square error at each iteration than all the other cost functions. Also, the symbol error rate and the intersymbol interference are significantly lower for each successive iteration.

FIGS. 10A-10D show eye patterns of these cost functions at the 20,000$^{th}$ iteration. FIG. 10A represents the single term cost function, FIGS. 10B and 10C correspond to CRIMNO I & II, and FIG. 10D shows the performance of the adaptive weight CRIMNO cost function. It can be seen that there is little difference between the CRIMNO I cost function and the CRIMNO II cost function. This is because of the small step-size $\alpha$ used for the stability of these techniques. The adaptive weight CRIMNO cost function clearly provides the best performance, as evidenced by the more pronounced clustering of signal points.

Figure 11A:
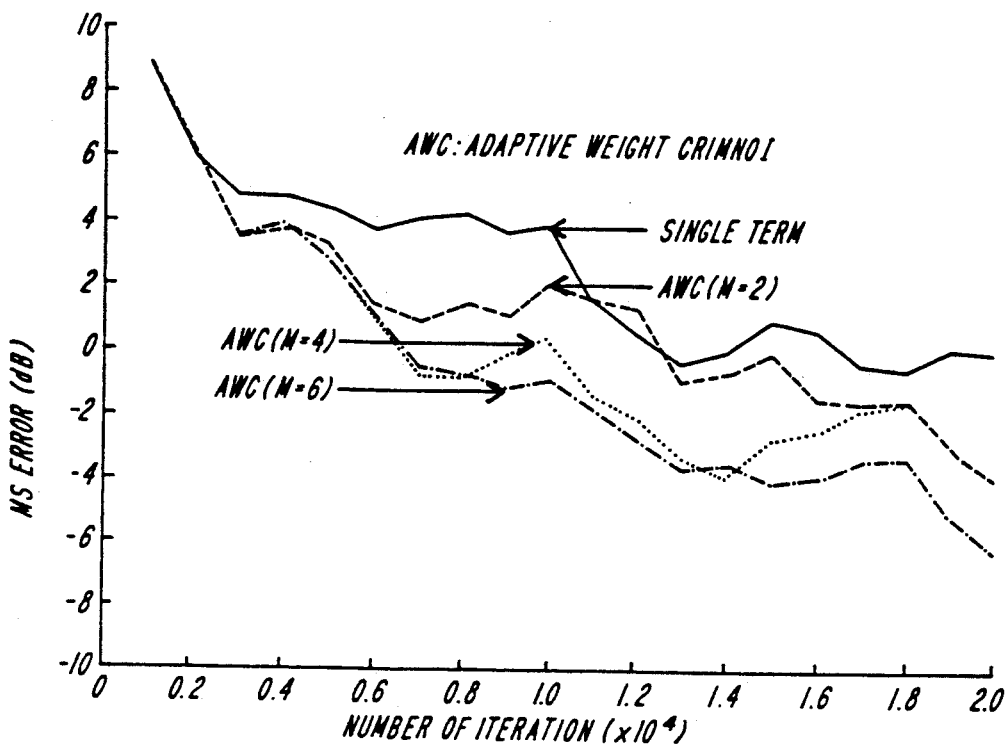
FIGS. 11A, 11B, and 11C are graphs of the performance of the adaptive weight CRIMNO cost function for different memory sizes.
Figure 11B:
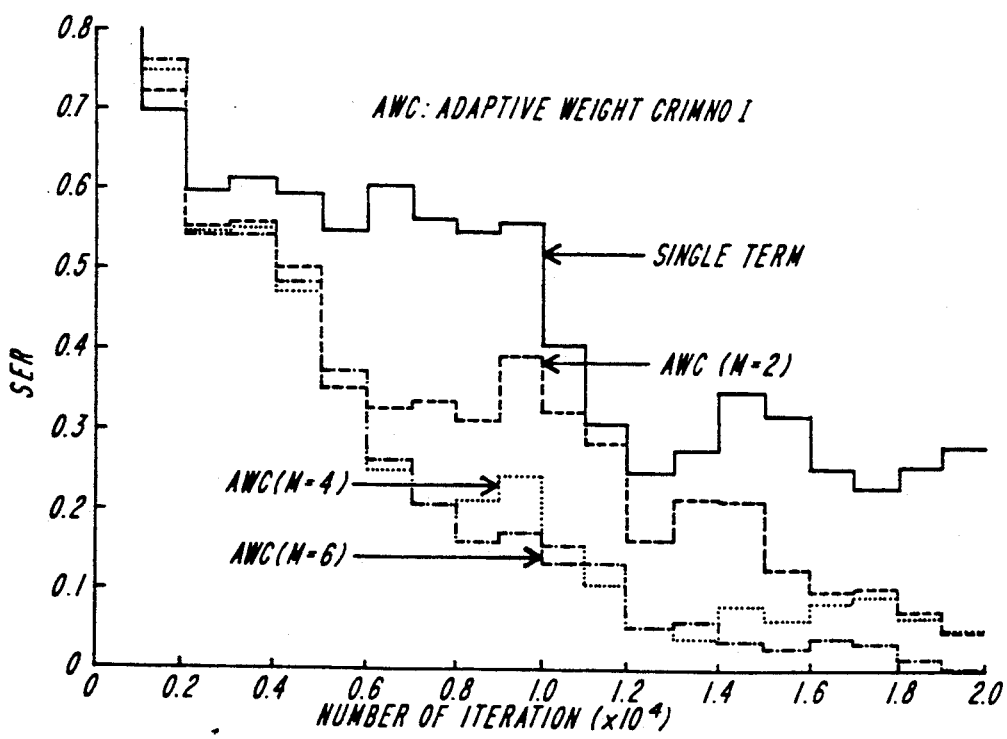
Figure 11C:
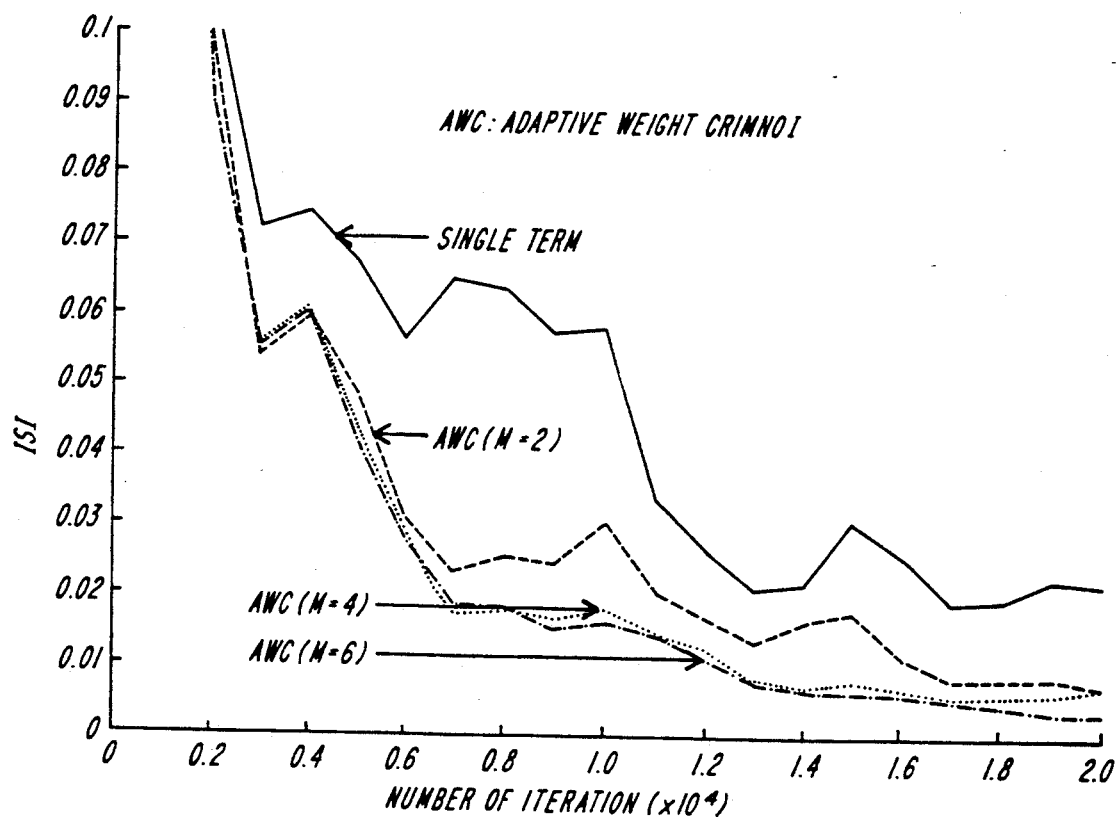
Figure 12A:
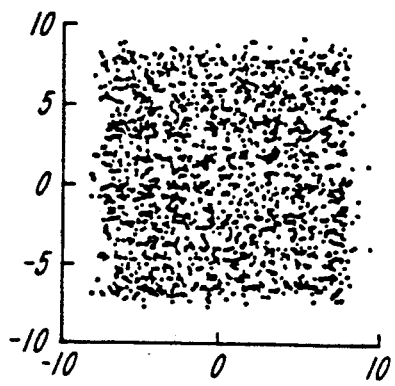
FIGS. 12A-12D are equalizer eye patterns corresponding to the cost functions of FIGS. 11A-11C.
Figure 12B:
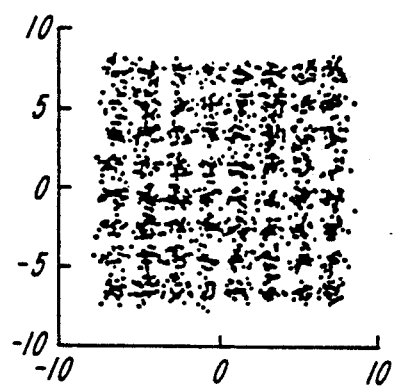
Figure 12C:
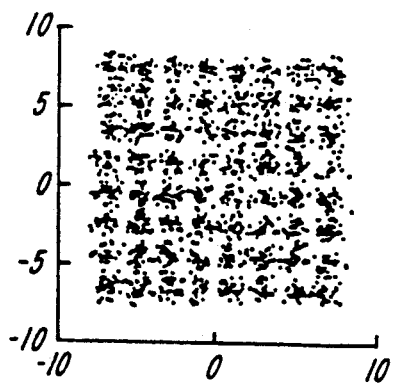
Figure 12D:
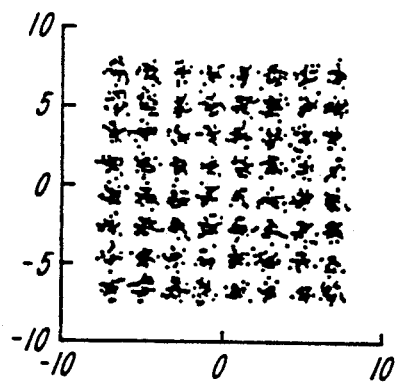

FIGS. 11A, 11B, and 11C show the performance of the adaptive weight CRIMNO cost function for different memory sizes M. These figures illustrate that performance of the adaptive weight CRIMNO cost function improves as the memory size increases.

FIGS. 12A–12D show the corresponding equalizer eye patterns. It is clear from the figures that the larger the memory M, the better the performance, i.e., the more distinctly the clusters of signal points form.

TABLE 1

| | SINGLE TERM | CRIMNO (memory size M) | | Adaptive Weight CRIMNO (memory size M) |
|---|---|---|---|---|
| | | Version I | Version II | Version I |
| Real Multiplication | $4N + 5$ | $4N + 3M + 5$ | $MN + 8M + 4N + 5$ | $4N + 8M + 5$ |

Table 1 summarizes the computational complexity of the single term, the CRIMNO, and the adaptive weight CRIMNO cost functions. From this table it is evident that the computational complexity of the adaptive weight CRIMNO cost function is almost the same as that of the single term cost function for small M.

Although the foregoing discussion relates to blind equalizers realized with linear transversal filters, the invention can also be implemented as a T-spaced equalizer or a T/2-spaced equalizer, for example.

Other modifications and implementations will occur to those skilled in the art without departing from the spirit and the scope of the invention as claimed. Accordingly, the above-description is not intended to limit the invention except as indicated in the following claims.

What is claimed is:

1. An adaptive blind channel equalizer system comprising:
    a channel equalizer with a plurality of equalizer coefficients, responsive to a transmitted data signal distorted by a channel and to a coefficient update signal, for providing an equalized signal;
    a coefficient update module, connected to the channel equalizer and responsive to the transmitted data signal distorted by the channel, for providing a plurality of updated equalizer coefficients to the channel equalizer for replacing the plurality of equalizer coefficients;
    a non-linear function evaluation module, connected to the output of the channel equalizer, for evaluating a non-linear function in response to said channel equalizer output to provide an error signal to said coefficient update module, the evaluation module including a memory for storing a plurality of past data symbols;
    an adaptive weight module, connected to the non-linear function evaluation module and to the channel equalizer, for providing a set of adaptively determined weights to be incorporated in the non-linear function;
    a scaling module, connected to the channel equalizer and responsive to the equalized signal, for providing a scaled signal; and
    a decision module, connected to the scaling module and responsive to the scaled signal, for providing a signal point in accordance with the scaled signal.

2. The adaptive blind channel equalizer system of claim 1 wherein the coefficient update module includes a memory for storing a plurality of equalizer coefficients.

3. The adaptive blind channel equalizer system of claim 1 wherein the coefficient update module generates said plurality of updated equalizer coefficients by subtracting a multiplicative product of an incremental step-size, the transmitted data signal distorted by the channel, and the error signal, from a plurality of previous equalizer coefficients.

4. The adaptive blind channel equalizer system of claim 1 wherein the non-linear function evaluation module evaluates said non-linear function and subtracts the result from the equalized signal to provide the error signal.

5. The adaptive blind channel equalizer system of claim 4 wherein the non-linear function includes a plurality of weighted terms.

6. The adaptive blind channel equalizer system of claim 4 wherein the non-linear function is a function of a current equalized signal and a plurality of previous equalized signals.

7. The adaptive blind channel equalizer system of claim 4 wherein the non-linear function is a product of a current equalized signal $z_n$ and an expected value of the square of the norm of the current equalized signal $E(|z_n|^2)$.

8. The adaptive blind channel equalizer system of claim 4 wherein the non-linear function is:

$$g[Z_n] = z_n - z_n[4w_0|z_n|^2 + 2w_1|z_{n-1}|^2 + \ldots + 2w_M|z_{n-M}|^2 - 4w_0 R_2]$$

9. The adaptive blind channel equalizer system of claim 1 wherein the adaptive weight module includes:
    a moment module, responsive to the equalized signal, for determining a current moment $J_0$ and a plurality of subsequent moments $J_i$;
    a deviation module, connected to the moment module, for providing a deviation including the norm of the difference between a subsequent moment $J_i$ and a moment at perfect equalization $J_i^{(0)}$; and
    a weight determination module, connected to the deviation module, for providing a first weight that is proportional to a deviation of the current moment from the moment at perfect equalization, only if the first weight is less than a stability threshold, otherwise providing the stability threshold as the first weight, and
    for providing at least one subsequent weight that is proportional to a deviation of the current moment from the moment at perfect equalization, only if the subsequent weight is less than the stability threshold, otherwise providing the stability threshold as the subsequent weight.

10. The adaptive blind channel equalizer system of claim 9 wherein the plurality of subsequent moments $J_i$ is equal to $|E(z_n z^*_{n-i})|$ for a statistically independent, uncorrelated sequence.

11. The adaptive blind channel equalizer system of claim 9 wherein the plurality of subsequent moments $J_i$ is equal to $|E(z_n z^*_{n-i}) - R(i)|^2$ for a statistically dependent sequence of known autocorrelation $R(i)$, where $i = 1, \ldots, M$.

12. The adaptive blind channel equalizer system of claim 1 wherein the scaled signal is characterized by a variance that is substantially the same as the variance of the transmitted data signal.

13. Apparatus for adjusting a plurality of coefficients of a channel equalizer that is responsive to a distorted transmitted data signal and that provides an equalized signal, the apparatus comprising:

a coefficient update module, connected to the channel equalizer and responsive to the distorted transmitted data signal, for providing a plurality of updated equalizer coefficients to the channel equalizer for replacing the plurality of equalizer coefficients;

a non-linear function evaluation module, connected to the output of the channel equalizer, for evaluating a non-linear function in response to said channel equalizer output to provide an error signal to said coefficient update module, the evaluation module including a memory for storing a plurality of past data symbols; and an adaptive weight module, connected to the non-linear function evaluation module and to the channel equalizer, for providing a set of adaptively determined weights to be incorporated in the non-linear function.

14. The apparatus for adjusting a plurality of coefficients of a channel equalizer of claim 13, further comprising:

a scaling module, connected to the channel equalizer and responsive to the equalized signal, for providing a scaled signal.

15. The apparatus for adjusting a plurality of coefficients of a channel equalizer of claim 13, wherein the coefficient update module generates said plurality of updated equalizer coefficients by subtracting a multiplicative product of an incremental step-size, the transmitted data signal distorted by the channel, and the error signal, from a plurality of previous equalizer coefficients.

16. The apparatus for adjusting a plurality of coefficients of a channel equalizer of claim 13 wherein the non-linear function evaluation module evaluates a non-linear function and subtracts the result from the equalized signal to provide the error signal.

17. A method for adaptive blind equalization comprising the steps of:

providing an equalized signal from a channel equalizer with a plurality of equalizer coefficients, the channel equalizer being responsive to a transmitted data signal distorted by a channel;

providing a set of adaptively determined weights in accordance with the equalized signal;

storing a plurality of past data symbols of the equalized signal in a memory;

evaluating a non-linear function using the set of adaptively determined weights and the plurality of past data symbols to provide an error signal;

providing a plurality of updated equalizer coefficients to the channel equalizer for replacing the plurality of equalizer coefficients in accordance with the error signal and the transmitted data signal distorted by a channel;

providing a scaled signal in accordance with the equalized signal; and providing a signal point in accordance with the scaled signal.

18. The method of adaptive blind equalization of claim 17 wherein the step of providing a plurality of updated equalizer coefficients includes the steps of:

subtracting a multiplicative product of an incremental step-size, the transmitted data signal distorted by the channel, and the error signal, from a plurality of previous equalizer coefficients.

19. The method for adaptive blind equalization of claim 17 wherein the step of evaluating a non-linear function includes the steps of:

evaluating a non-linear subexpression and subtracting the result from the equalized signal to provide the error signal.

20. The method for adaptive blind equalization of claim 17 wherein the step of providing a scaled signal is executed such that the equalizer output is scaled dynamically, and the equalizer output attains the same variance as that of the transmitted data signal.

21. The method for adaptive blind equalization of claim 17 wherein the step of providing a set of adaptively determined weights includes the steps of:

determining a current moment $J_0$ and a plurality of subsequent moments $J_i$;

providing a deviation including the norm of the difference between a subsequent moment $J_i$ and a moment at perfect equalization $J_i^{(0)}$; and providing a first weight that is proportional to a deviation of the current moment from the moment at perfect equalization, only if the first weight is less than a stability threshold, otherwise providing the stability threshold as the first weight, and providing at least one subsequent weight that is proportional to a deviation of the current moment from the moment at perfect equalization, only if the subsequent weight is less than the stability threshold, otherwise providing the stability threshold as the subsequent weight.

22. The method for adaptive blind equalization of claim 21 wherein the plurality of subsequent moments $J_i$ is equal to $|E(z_n z^*_{n-i})|$ for a statistically independent, uncorrelated sequence.

23. The method for adaptive blind equalization of claim 21 wherein the plurality of subsequent moments $J_i$ is equal to $|E(z_n z^*_{n-i}) - R(i)|^2$ for a statistically dependent sequence of known autocorrelation $R(i)$, where $i = 1, \ldots, M$.

24. A method of updating a plurality of equalizer coefficients of a channel equalizer comprising the steps of:

providing an equalized signal from the channel equalizer with a plurality of equalizer coefficients, the channel equalizer being responsive to a transmitted data signal distorted by a channel;

providing a set of adaptively determined weights in accordance with the equalized signal;

storing a plurality of past data symbols of the equalized signal in a memory;

evaluating a non-linear function using the set of adaptively determined weights and the plurality of past data symbols to provide an error signal; and providing a plurality of updated equalizer coefficients to the channel equalizer for replacing the plurality of equalizer coefficients in accordance with the error signal and the transmitted data signal distorted by a channel.

* * * * *

UNITED STATES PATENT AND TRADEMARK OFFICE
CERTIFICATE OF CORRECTION

PATENT NO. : 5,282,225  
DATED : January 25, 1994  
INVENTOR(S) : Chrysostomos L. Nikias, et al.

It is certified that error appears in the above-indentified patent and that said Letters Patent is hereby corrected as shown below:

On the title page, Item [75]:

[75] Inventors: Chrysostomos L. Nikias, Rancho Palos Verdes, Calif.; John G. Proakis, Lexington, Mass.; and Yuanjie Chen, Irvine, Calif.

Signed and Sealed this

Sixth Day of September, 1994

Attest:

BRUCE LEHMAN

*Attesting Officer*   *Commissioner of Patents and Trademarks*